ical Examiner—James W. Moffitt

United States Patent [19]
Littwin

[11] 4,133,045
[45] Jan. 2, 1979

[54] CYLINDRICAL DOMAIN MEMORY

[75] Inventor: Burkhard Littwin, Hohenschäftlarn, Germany

[73] Assignee: Siemens Aktiengesellschaft, Berlin & Munich, Germany

[21] Appl. No.: 818,443

[22] Filed: Jul. 25, 1977

[30] Foreign Application Priority Data
Aug. 18, 1976 [DE] Fed. Rep. of Germany ....... 2637226

[51] Int. Cl.² ............................................. G11C 19/08
[52] U.S. Cl. ......................................... 365/39; 365/14
[58] Field of Search ..................................... 365/39, 43

[56] References Cited
U.S. PATENT DOCUMENTS
| | | | |
|---|---|---|---|
| 4,027,297 | 5/1977 | Bullock | 365/39 |
| 4,067,002 | 1/1978 | Chang | 365/43 |

Primary Examiner—James W. Moffitt
Attorney, Agent, or Firm—Hill, Gross, Simpson, Van Santen, Steadman, Chiara & Simpson

[57] ABSTRACT

A cylindrical domain memory has a storage medium constructed in layer form which is provided with cylindrical domains which are magnetized at right angles to the layer plane, the magnetization being directed opposite to the magnetization of the surrounding material and to that of the magnetic bias field. A propagation structure has an overlay pattern of individual elements of magnetizable material applied in the form of layers to the one layer plane and a rotary magnetic field is directed parallel to the layer plane, which field causes displacement of the cylindrical domains along a path determined by the propagation structure. The propagation structure comprises L-shaped individual elements which are staggered in stepped fashion relative to one another.

3 Claims, 6 Drawing Figures

CYLINDRICAL DOMAIN MEMORY

BACKGROUND OF THE INVENTION

1. Field of the Invention

The present invention relates to cylindrical domain memories having a storage medium constructed in layer form and consisting, for example, of magnetic garnet or orthoferrite, in which the cylindrical domains are magnetized at right angles to the layer plane and in a direction opposite to the magnetization of the vicinity of the domains and to that of a magnetic bias field. More specifically, the structure is provided with a, preferably, periodic propagation and manipulation pattern the individual elements of which consist of magnetizable material, in particular a magnetostriction-free Ni-Fe alloy, and are applied in the form of layers to the one layer of the storage medium, and a rotary magnetic field is directed parallel to the layer plane for causing the cylindrical domains to be displaced along a path defined by the manipulation pattern.

2. Description of the Prior Art

In the rotating magnetic field, the individual elements of the manipulation pattern produce stray magnetic fields which cause the cylindrical domains to travel to energetically favorable positions on the individual elements. When the rotating magnetic field is rotated in the layer plane these energy minima disappear. They are replaced, at other locations of the manipulation pattern, by new minima toward which the cylindrical domains travel. With suitable manipulation patterns, on one full rotation of the rotary magnetic field the cylindrical domains advance by one period of the manipulation pattern, i.e. by one storage position. In a constantly rotating magnetic field, the cylindrical domains can be propagated along paths which are predetermined by the manipulation pattern.

By providing long, closed loops (so-called "storage loops") it is possible to construct serial memories. The binary digits "1" and "0" are represented by the presence or absence of a cylindrical domain at a point of the manipulation pattern. The information input into the storage loop is written in and read out by way of a write-read loop. The information is not tied to a fixed storage position, but circulates in closed paths of the manipulation pattern. Manipulation patterns of the above-mentioned type are described, for example, by Mitchell S. Cohen and Hsu Chang in their article "*The Frontiers of Magnetic Bubble Technology*", published in the "Proc. of the IEEE", Vol. 63, No. 8, August 1975, pp. 1196–1206, and by Franz Parzefall, Burkhard Littwin, and Werner Metzdorf, in their article entitled "*X-Bar, a New Propagation Pattern for Magnetic Bubbles*", published in the "IEEE Trans. on Magnetics", Vol. MAG-9, No. 3, September 1973, pp. 293–297, these publications being fully incorporated herein by this reference for their teachings of the environmental aspects of memories which may be improved by the practice of the present invention. In these cases, T-shaped, X-shaped and Y-shaped elements serve as individual elements. The German published application No. 1,917,746 discloses Ti-manipulation patterns and patterns comprising rectangular individual elements, the direction of which is inclined toward the path of the cylindrical domains.

Conventionally, in order to provide a low-cost and space-saving memory, it is endeavored to produce a memory having a high bit density, i.e. involving low costs per bit. Storage chips comprising, e.g. $5 \times 5$ mm storage layers, provided with transport structures and conductor loops are in common use. The current storage capacity which can be achieved by means of photolithographic processes, i.e. the storage chip capacity, is 64 k-bits. It is not possible to increase the fineness of the propagation structures employed in the storage loops beyond the storage capacity by employing photolithographic processes.

As is known from the article "*Magnetic Bubbles—An Emerging New Memory Technology*", by Andrew H. Bobeck, Peter I. Bonyhard and Joseph E. Geusic, published in the "Proc. of the IEEE", VOL. 63, No. 8, August 1975, pp. 1176–1195, also fully incorporated herein by this reference, and from the aforementioned Cohen et al article, it is in fact possible to employ electron beam lithography to produce the conductor loops and transport structures, e.g. manipulation patterns, for the desired storage chip capacities of 256 k-bits and greater, but from the technical viewpoint this process is extremely expensive and complicated, and furthermore does not feature the short cycle times of conventional photolithography. Therefore, for example, by new developments as described in the Cohen et al publication, attempts have been made to achieve high storage densities without imposing strict requirements on the structure production.

SUMMARY OF THE INVENTION

The object of the present invention is to provide improved propagation structures, i.e. manipulation patterns, domain paths and domain generators and conductor loops for storage chips of high capacity, e.g. 256 k-bits simply by employing conventional photolithography.

For this purpose, in a cylindrical domain memory of the type described in the introduction, the present invention proposes that the propagation structures comprise an overlay pattern of magnetizable L-shaped individual elements which are staggered in stepped fashion, where advantageously one leg of each L-shaped individual element has a width which is greater than, in particular 1.5–3 times the width of the other leg.

Advantageously, the manipulation patterns, which are composed of these individual elements and are provided for the storage loops and read-write loops, are in each case staggered in relation to one another. During one period of the magnetic field rotation, the cylindrical domain moves along the L-shaped element or individual element and must leap over one gap per period.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
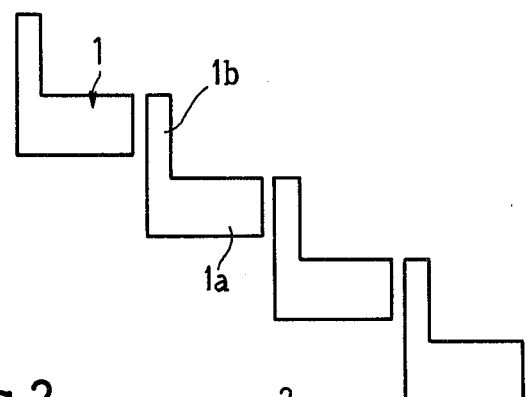
FIG. 1 is a schematic illustration of an exemplary embodiment of a transport structure constructed in accordance with the present invention.

Referring to FIG. 1, a plurality of L-shaped individual elements of the magnetizable overlay pattern, hereinafter called L-bars, are referenced 1 and are positioned in stepped relation to one another. Each L-bar 1 comprises a leg 1a which is wider than the other leg 1b, in particular two to three times as wide and preferably 1.5–3 times as wide.

Figure 2:
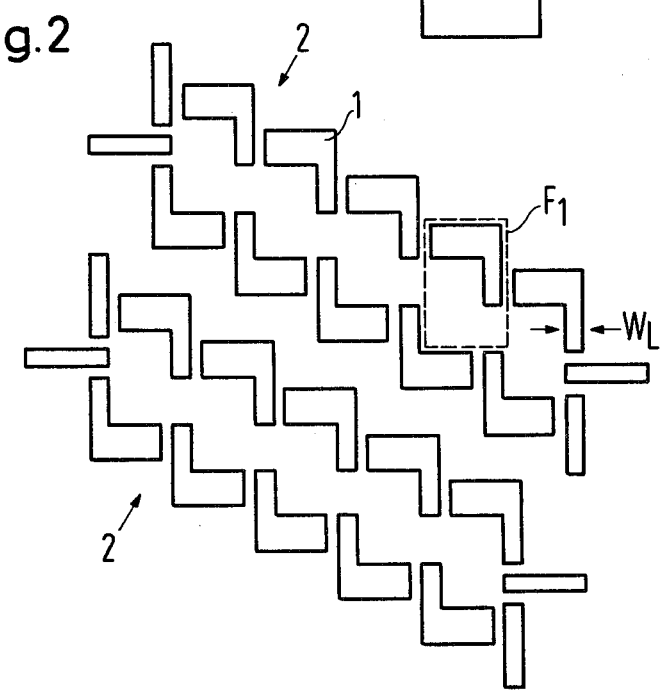
FIG. 2 is a schematic illustration of an exemplary embodiment of storage loops which are staggered in relation to one another in the sense indicated in FIG. 1.

In FIG. 2, the L-bars 1 are arranged so as to constitute storage loops 2 and, assuming that a plurality of storage loops 2 are provided, the loops are disposed in a staggered relation to one another.

Figure 3:
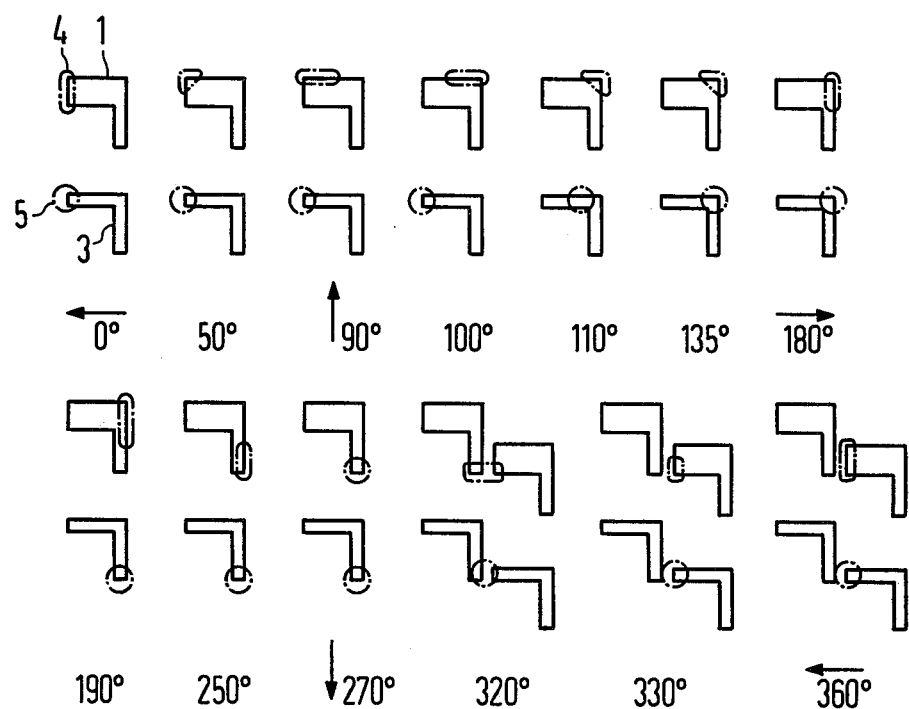
FIG. 3 is a schematic illustration, in a comparative sense, showing the position of a cylindrical domain in dependence upon the phase angle of the rotating magnetic field in an L-shaped element constructed in accordance with the invention and in a known Chevron element.

Referring to FIG. 3, the dependence of the position of a cylindrical domain 4, 5 upon the phase angle of the rotary magnetic field, which is illustrated in FIG. 3 by phase angle markings, and in fact in relation to an L-bar element 1 and a Chevron element 3, has been considered quasistatistically and recorded for specific phase states. This illustration shows that the phase shift between the cylindrical domain and the rotary magnetic field is noticeably greater in the case of a single Chevron angle. Furthermore, it can be seen from FIG. 3 that in contrast to the L-bar 1, the cylindrical domain in the rotary magnetic field has preferred rest positions at the ends of the Chevron element 3. During the domain propagation along the Chevron 3, this leads to domain speeds which are twice those occurring in the case of the L-bar 1, since in contrast to the last-mentioned element, as a result of the phase delay, less than half the time is available for equal length paths. This results in a correspondingly lower frequency limit with a given domain mobility and unfavorable fault statistics. For this reason, only storage loops having multiple Chevron angles are known, where a storage cell is in each case formed from three Chevron angles arranged one above another, and it is only by means of this measure that the aforementioned phase delay and the consequences thereof is avoided. However, this is accompanied by a reduction in the storage density and storage capacity. Finally, in propagation structures whose bar elements possess half the width of the cylindrical domain, it is necessary to adhere to a structure period corresponding to four times the domain diameter in order to avoid propagation difficulties arising from domain/domain interactions.

Figure 4:
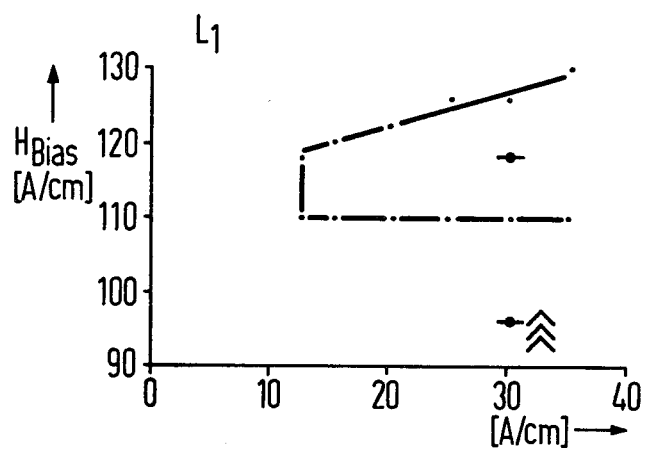
FIGS. 4–6 are each graphic illustrations of the quasi-statistical operating ranges of three differen storage loops constructed in accordance with the present invention.
Figure 5:
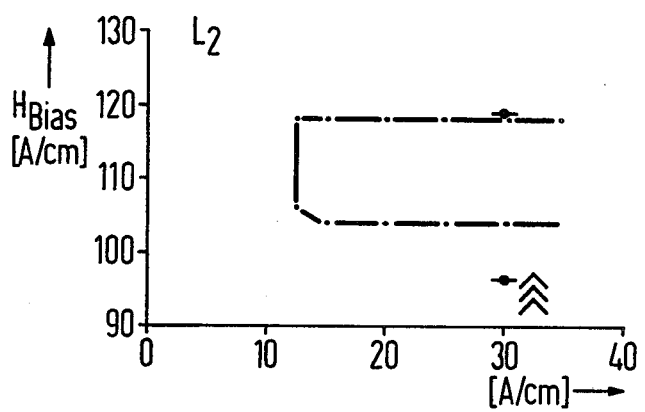
Figure 6:
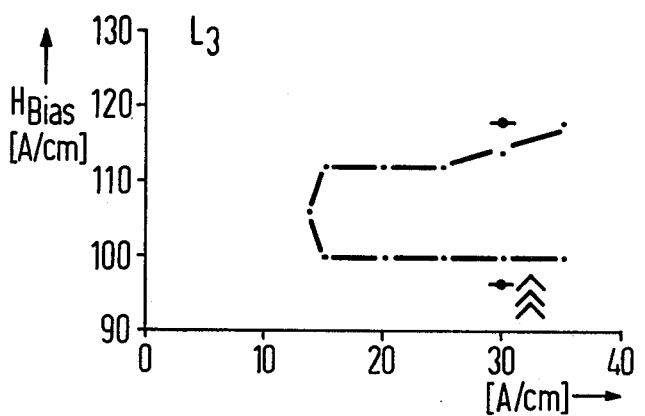

FIGS. 4–6 illustrate the quasistatistical operating ranges for three different L-bar storage loops each having a storage capacity of seven bits and structure periods of 26 μm, 22 μm and 17 μm, respectively, for the manipulation patterns $L_1$, $L_2$ and $L_3$, respectively. For a rotary magnetic field of 30 A/cm, the operating range of a three-angle-Chevron pattern with a period of 28 μm has been additionally entered on each graph. With a rotary magnetic field $H_{rot}$ of 30 A/cm, operating ranges of 14%, 14%, 17% and 20% were determined for the manipulation patterns $L_3$, $L_2$, $L_1$ and the Chevron pattern, respectively. The operating range of the manipulation pattern $L_1$ (see FIG. 4) admittedly only half overlaps that of the Chevron pattern, but the operating ranges of the manipulation patterns $L_2$ and $L_3$ lie within the Chevron operating range. The manipulation patterns for the storage loops were established on a storage wafer, in particular in garnet wafer, with 6 μm domains, where the $SiO_2$ spacing layer directly applied to the storage wafer has a thickness of 0.7 μm, and the Ni-Fe layer arranged upon the latter has a thickness of 0.35 μm. The lower limit of the operating range was determined with an individual domain in the storage loops, whereas the upper limit of the operating range was measured on the fully populated storage loops. In order to determine the lower limit, the magnetic support field is reduced until the domain loses its cylindrical shape. The upper limit is determined by the magnetic support field at which individual domains begin to collapse. The operating range is determined by the sum of the absolute quantities of the percentage deviations of the upper and lower limits from the mean value of the two limits.

The active storage area for one row of L-bar structures, provided with various dimensions and for various storage capacities, is set forth below in tabular form.

TABLE 1

| L-bar Structure | I ($L_2$) | II($L_3$) | III | IV |
|---|---|---|---|---|
| Bar Widths-a/b-(μm) | 8/4 | 6/3 | 4/2 | 3/1.5 |
| Gap Widths (μm) | 2 | 2 | 1 | 1 |
| Period (μm) | 22 | 17 | 11 | 8.5 |
| Bit Density ($10^5$/cm$^2$) | 1.8 | 3.2 | 7.4 | 13 |
| Storage Capacity (kbit) | 32 | 64 | 128 | 256 |
| Storage Area (mm$^2$) | 4.2 × 4.2 | 4.5 × 4.5 | 4.2 × 4.2 | 4.5 × 4.5 |

For L-bar structures having different dimensions, the table indicates the densities and storage areas for various storage capacities.

The increased storage density of the L-bar structure, compared with the known bar structures, is achieved by means of a closer domain spacing. When fully populated, the storage loops which have been investigated in accordance with FIG. 6 and which have an L-bar structure with a period of 17 μm, have a domain spacing of three domain diameters. This is in contrast to the spacing of four domains which is normally employed in known bar structures, as the permitted minimum spacing between two domains within a propagation loop, which, when undershot, jeopardizes the reliability of the domain propagation. In fact, below this minimum spacing, the interaction between adjacent domains which is caused by stray magnetic fields emanating from the domains, becomes so marked that the individual domains disappear from the propagation loop and consequently it is difficult to achieve a domain propagation with a fully populated storage loop.

A comparison with the known propagation structures, such as for example T-bar propagation structures, X-bar propagation structures and Y-bar propagation structures, indicates that in contrast to these known structures the L-bar propagation structures are insulated from one another, for which reason there is no undesirable transposition of domains into other storage loops via magnetic bar structures which are located transversely to the propagation direction of the domain and are common to various storage loops. The similar nature of the domain movement in the L-bar element and in the known Chevron element allows an optimum exploitation of the transportation properties of both elements, so that the operating ranges of the storage loops provided with L-bar elements can be fully overlapped by those of the Chevron element.

The structure of the L-bar and the simple lining up of the structure elements enable the period, and thus the size of the bar elements upon a storage chip, to be varied as required. Wherever adjustments are necessary, as in the region of the gates and the domain detector, larger structure elements having periods of, e.g. 22 μm and 28 μm can be used, whereas in the region of the storage loops having shorter periods of, e.g. 17 μm, a high storage density is achieved.

By simple geometric considerations, it may be deduced from FIG. 2 that a L-bar storage cell requires the following area space:

$$F_1 = 34.3 \times w_L^2.$$

Consequently the storage density is:

$$\delta = 1/F_1 = (34.3 \times W_L^2)^{-1},$$

where $w_L$ is the width of the narrow leg of the L-bar element.

According to the aforementioned Cohen et al article, the storage density $\delta_{TXY}$ is given for the T-bar propagation structure, X-bar propagation structure and Y-bar propagation structure, where $$\delta_{TXY} = (64 \times w_{TXY}^2)^{-1}$$

where $w_{TXY}$ is the bar width of the T-bar pattern, X-bar pattern and X-bar pattern.

If the smallest distance within a propagation pattern, namely the gap, is assumed to have a length of 1 μm, the investigations of the propagation behavior in the case of the bar width $w_{TXY}$ of the known propagation pattern indicate a value of 2 μm for the bar width $w_{TXY}$ and a value of 1.5 μm for the width of the narrow leg of the L-bar element. This means that the L-bar propagation pattern can have a storage density which is 3.4 times greater than known propagation patterns. The high storage density facilitates a production of a 256 kbit storage chip employing conventional, low-cost photolithography. Even with storage capacities of only 64 kbit and the storage area of 4 × 5 mm, T-bar elements, X-bar elements and Y-bar elements have bar widths of 2 μm and gap widths of 1 μm. Therefore, relative to the same area, a 256 kbit storage chip produced from these known elements requires a doubly fine structure and, having bar widths of 1 μm and gap widths of 0.5 μm, lies outside the photolithography range. In contrast, investigations carried out on the L-bar propagation structure for storage loops having a period of 17 μm have shown that a 64 kbit storage chip having bar widths of 3 μm and gap dimensions of 2 μm can be produced on a storage area of 4.5 × 4.5 mm. The bar width and the gap for the propagation structures of a 256 kbit storage chip are then 1.5 μm and 1 μm, respectively, and thus are still in the range which can be achieved by photolithography.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a cylindrical domain memory of the type having a storage medium constructed in layer form including cylindrical domains which are magnetized at right angles to the plane of one layer, which magnetization is directed opposite to that of the adjacent area and to that of a magnetic bias field, a propagation structure comprising an overlay pattern of individual elements of magnetizable material in the form of layers carried on the one layer, and a rotary magnetic field parallel to the one layer for causing displacement of the cylindrical domains along a path determined by the propagation structure, the improvement wherein:

said individual elements of said propagation structure each include an L-shaped structure, each of said L-shaped structures comprising two legs, one of said legs having a width which is greater than that of the other of said legs, said elements staggered in stepped fashion relative to one another.

2. The improved cylindrical domain memory of claim 1, wherein:

said one leg has a width in the range of 1.5 to 3 times the width of the other leg.

3. The improved cylindrical domain memory of claim 2, wherein:

a plurality of said elements disposed to provide manipulation patterns for storage read and write loops, a plurality of such loops being staggered relative to one another.

* * * * *